(12) United States Patent
Simpson

(10) Patent No.: US 6,278,596 B1
(45) Date of Patent: Aug. 21, 2001

(54) ACTIVE GROUND FAULT DISCONNECT

(75) Inventor: Robert D. Simpson, Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/335,870

(22) Filed: Jun. 17, 1999

(51) Int. Cl.[7] .................................................. H02H 3/00
(52) U.S. Cl. ............................. 361/42; 361/58; 361/93.7; 361/101; 361/106
(58) Field of Search ..................... 361/93.9, 106, 361/42–43, 58, 91.1–93.2, 93.7, 93.8, 100–101; 324/110, 115, 116, 126

(56) References Cited

U.S. PATENT DOCUMENTS

| | | |
|---|---|---|
| 3,959,695 | 5/1976 | Shimp . |
| 4,031,431 | 6/1977 | Gross . |
| 4,068,281 | 1/1978 | Harnden, Jr. . |
| 4,087,846 | 5/1978 | Hughes et al. . |
| 4,109,226 | 8/1978 | Bowling et al. . |
| 4,375,660 | 3/1983 | Tate et al. . |
| 4,583,146 | 4/1986 | Howell . |
| 4,967,176 | 10/1990 | Horsma et al. . |
| 5,142,221 * | 8/1992 | Meldrum et al. ..................... 324/115 |
| 5,250,893 * | 10/1993 | Gambill et al. ....................... 324/115 |
| 5,296,996 * | 3/1994 | Hansson et al. ........................ 361/24 |
| 5,379,176 | 1/1995 | Bacon et al. . |
| 5,418,450 * | 5/1995 | Bacon .................................. 324/110 |
| 5,637,990 | 6/1997 | Kato et al. . |
| 5,644,461 | 7/1997 | Miller et al. . |
| 5,763,929 * | 6/1998 | Iwata .................................... 257/467 |
| 5,864,458 | 1/1999 | Duffy et al. . |
| 5,886,860 * | 3/1999 | Chen et al. ............................... 361/9 |
| 6,072,681 * | 6/2000 | Cogan et al. ......................... 361/106 |
| 6,181,541 * | 1/2001 | Souri et al. .......................... 361/106 |

* cited by examiner

Primary Examiner—Michael J. Sherry
(74) Attorney, Agent, or Firm—Boulden G. Griffith; Thomas F. Lenihan

(57) ABSTRACT

A circuit for detecting and automatically responding to ground faults. A passive protection PTC resistor is coupled in series with an active protection switch, the active protection switch being controlled by a control circuit to open the switch when excess current is detected to be flowing in the common path of one of the channels. Floating and grounded versions are described.

9 Claims, 6 Drawing Sheets

ACTIVE GROUND FAULT DISCONNECT

FIELD OF THE INVENTION

This invention relates to circuitry for providing protection against ground fault currents in electronic instruments that might damage the circuit-under-test or be harmful to personnel, and more particularly such circuitry providing multiple levels of protection.

BACKGROUND OF THE INVENTION

Existing designs for operator and circuit-under-test protection in the presence of potentially dangerous or damaging ground fault currents has been accomplished using positive temperature coefficient (PTC) circuit elements and mechanical relays and switches. While such protection can prevent fire and explosions by limiting extreme currents, they may not respond sufficiently to marginal or transient amounts of energy to fully protect the operator's safety and the circuit-under-test under all circumstances.

Referring to FIG. 1A, while "floating" (ungrounded) operation is relatively simple and inexpensive, under fault conditions a very high current flow can arise from a relatively small voltage, because of the extremely low impedance from one probe common (ground) to another. Once the instrument is "floating", the error of inadvertently connecting one of the commons to a high voltage can make all other exposed commons unexpectedly "hot", potentially dangerous to either personnel or circuitry-under-test.

Even if the user does not receive a shock by coming into contact with the unexpectedly "hot" lead or exposed floating regions of the instrument, connecting a second common to earth ground can cause an explosive and terrifying flash and arcing. The user may be burned or incur secondary injuries as a reaction to being startled by the sudden and explosive flow of large currents where they were not expected.

Introducing an unexpectedly high voltage into parts of the user's circuit which are normally near zero can also have damaging effects on the circuit under test. Even if such contact is inadvertent, the effects can be catastrophic to unprotected elements of the circuit under test. Even dropping or dragging such a floating "hot" common line so that it comes into contact with other circuit elements, can have unexpected consequences that cause permanent damage to the user's circuit. Non-floating, earth grounded operation, can still lead to unfortunate surprises, affecting both the operator's safety and the integrity of the elements of the circuit under test.

Referring next to FIG. 1B, the common leads are protected against anything more than transient and limited voltages by the incorporation of a PTC resistor in series with the ground path. Now unexpected current surges raise the resistance of the PTC resistor, and dramatically limit the maximum current that can flow, at least for any significant length of time. This circuit is still rather simple, yet it prevents the occurrence of the arcs and explosions of the previously discussed prior art circuit. Providing this circuitry with a second level of protection requires that other steps be taken to limit the exposure of all instrument commons to sudden and unexpected currents. Probes must be specially insulated. To achieve true double isolation, all of the other input/output functions and exposed conductors must also be protected against unexpectedly high voltages.

U.S. Pat. No. 4,583,146 to Howell for "Fault Current Interrupter", hereby incorporated by reference, discloses a fault current interrupter achieved by the parallel combination of a PTC resistor and a voltage dependent resistor connected across a pair of mechanical contacts to permit the interruption of a flowing current without arcing during the separation of the contacts. The PTC resistor is selected to have a relatively low resistance at room temperature and a substantially higher resistance at higher temperatures. This allows the current to transfer away from the contacts through the PTC resistor until the voltage across the voltage dependent resistor causes the voltage dependent resistor to become conductive and thereby transfer the current away from the PTC resistor.

U.S. Pat. No. 4,967,176 to Horsma et al. for "Assemblies of PTC Circuit Protection Devices", hereby incorporated by reference, discloses a device assembly in which a plurality of PTC circuit protection devices are connected in series. Assemblies of this type are useful in providing protection where a lone device would not suffice. In a preferred system, the device assembly is connected in series with a circuit breaker. U.S. Pat. No. 5,644,461 to Miller et al. for "High Voltage D-C Current Limiter", is hereby incorporated by reference. This patent describes a current limiter for protecting a circuit at a predetermined driving voltage in excess of 50 volts. A plurality of PTC resistors are connected in series, with a zener diode connected in parallel with each of the PTC resistors. All of the PTC resistors, taken together, and all of the zener diodes, taken together, have a voltage range larger than the predetermined driving voltage.

U.S. Pat. No. 5,864,458 to Duffy et al. for "Overcurrent Protection Circuits Comprising Combinations of PTC Devices and Switches", hereby incorporated by reference, discloses electrical circuit protection arrangements with PTC devices to switch voltages and currents in normal circuit operations, wherein the voltage and/or current ratings of the mechanical switches and PTC devices are much less than the normal operating voltages and currents of the circuits. This feature permits the use of smaller and less expensive mechanical switches and PTC device than would otherwise be required in such circuits. The arrangements of switches and PTC devices also permit the PTC devices to limit the magnitude of the fault current passed to the circuit.

U.S. Pat. No. 4,068,281 to Harnden for "Thermally Responsive Metal Oxide Varister Transient Suppression Circuit", hereby incorporated by reference, describes a temperature responsive resistor that is thermally connected to a body of metal oxide varistor material in transient suppression and other applications. In the event of excess energy dissipation in the varistor, the temperature of the thermally responsive resistor increases to provide a trigger signal to a triac or other similar electronic switch which may be utilized to provide an alarm, provide increased cooling of the varistor body, to divert or limit current flow from the varistors. Current flow through the temperature responsive resistor may be provided from a third terminal on the metal oxide varistor in which case the circuit is responsive to both total energy dissipation and peak energy dissipation levels in the varistor.

U.S. Pat. No. 5,379,176 to Bacon et al. for "Protective Input Circuit for an Instrument", is hereby incorporated by reference. This patent describes a protective circuit for the input of a multimeter is provided with series connected thermistors partially shunted by a varistor whereby overload voltage is distributed between the thermistors enabling protection at higher voltage levels. Shunt connected varistors protect primarily against transient overloads and are thermally coupled to the aforementioned thermistors to bring the thermistors more rapidly to their high resistance condition such that damage to the varistors is avoided and continued protection is provided.

U.S. Pat. No. 5,250,893 to Gambill et al. for "Digital Voltmeter", hereby incorporated by reference, describes a voltage measuring instrument which generally includes signal conditioning circuitry coupled to input probes for protection against overvoltages and processing of input voltage signals. A VAC/VDC control circuit determines whether AC or DC voltages are present, and it will positively indicate when no voltage is present in a test circuit. The metering circuit of the invention will thereby automatically determine the proper mode of operation for the type of voltage present in a test circuit so as to eliminate user selection of operating parameters and possible errors. Further, the metering circuit is adapted to generate a proper reference voltage for the measured voltage automatically, to again eliminate selection of a voltage range by the user. A power supervision circuit is adapted to automatically shut off the measuring instrument after a predetermined amount of time has elapsed, and will automatically shut off power in the event that available battery power drops below a given level.

U.S. Pat. No. 4,031,431 to Gross for "Ground Fault Circuit Interrupter", hereby incorporated by reference, discloses an apparatus including polarity sensing means and a switch such as a Triac for providing a ground fault circuit interrupter system for an electrical load such as a hand-held appliance. The Triac is electrically connected in a completed circuit with the electrical load and is positively positioned in series with the line conductor of an AC power source.

U.S. Pat. No. 3,959,695 to Shimp for "Circuit Interrupter With Ground Fault Trip Control", hereby incorporated by reference, describes a circuit interrupter having an associated control system which senses overload current or ground fault current and causes an appropriate tripping of the circuit interrupter. Tripping energy for causing the circuit interrupter to open under a normal fault condition is derived from the fault current itself In addition, tripping energy for causing the circuit interrupter to open due to a ground fault condition is derived from the ground fault current.

U.S. Pat. No. 4,109,226 to Bowling et al. for "Disconnect Switch with Reset Mechanism", is hereby incorporated by reference. That patent describes a disconnected switch or hot wire relay for use with a ground fault circuit interrupter in a power circuit to load, such as an electric range, to provide ground fault protection for any circuit of the range. The switch has normally closed switch contacts, a biased actuator plunger, and an adjustable hot wire for releasing the latch and hence the plunger when the circuit is overloaded. The plunger of the switch is manually resettable from a remote position. The reset mechanism has an anti-tease or trip-from feature that prevents the operator from holding the disconnected contacts closed while a fault is present in the circuit.

U.S. Pat. No. 5,637,990 to Kato et al. for "High Speed, Large-Current Power Control Apparatus", is also hereby incorporated by reference. It discloses a power control apparatus for protecting an electrical circuit from excessive current and in particular for protecting it from a large and fast transition pulse caused by a rapid current polarity transition. At least two switching devices are coupled in series or in parallel between a power supply and a load. A gate signal is generated to change the switching devices from conductive state to a nonconductive state in response to detection of excessive current. The gate signal is delayed by a predetermined period of time to change the switching devices into the non-conducting state after all of the switching devices are saturated so that the rapid current polarity transition is eliminated.

U.S. Pat. No. 4,375,660 to Tate et al. for "Ground Isolation Monitoring Apparatus Having a Protective Circuit", hereby incorporated by reference, describes a ground isolation monitoring apparatus having a protective circuit for use between an AC power source and a utilization device, such as an electronic instrument. The protective circuit permits operation of the utilization device with earth ground disconnected, automatically reconnecting earth ground if a hazardous voltage or current appears on the device chassis or exposed metal parts. The protective circuit also monitors neutral-to-earth ground continuity and shuts off the AC power to the utilization device if the ground path opens or if the impedance thereof increases. Various other features may be provided to ensure safe operation of the device.

U.S. Pat. No. 4,087,846 to Hughes et al. for "Protective Circuit Apparatus" is hereby incorporated by reference. This patent describes a protective circuit for disconnecting power flow to an electrical device upon the sensing of a predetermined condition such as current flow above a predetermined level in the ground line or current flow in excess of a predetermined level in the power or hot line. In a preferred embodiment, the circuit for detecting excess current flow in the ground wire and the circuit for detecting excess current flow in the hot line are connected in series with a two to three wire converter circuit which ensures proper connection to a source of electrical energy.

Industry safety requirements dictate that a "floating" instrument should have "double insulation" or at least a means to limit a fault current that could expose the operator to a shock hazard. This means that all spacing from internal metal to external surfaces, or wherever "the standard finger" can touch, must be greater than a rated value. Different ratings determine which spacing values are appropriate. In general though, with a single channel and double insulation, there is no need for redundant (internal) protection because making a single connection to any allowable voltage will simply float the whole instrument internals to that potential. That is sufficiently safe because there is no exposed metal for current to flow through to get to the user even if the probe common is improperly connected to a high voltage.

One competitor's product takes the approach shown in FIG. 1B. It employs a PTC resistor in series with the common leads. This approach solves the fire hazard concern because the PTC resistor heats up fast enough and changes resistance value dramatically in the presence of a serious common current. Increased resistance limits the current and the energy available for causing harm to the circuit under test or the instrument during a fault. Unfortunately, the energy limitation provided by this technique is not low enough to ensure human or equipment safety under all circumstances. This condition is then addressed by using special probes with extra insulating plastic to shield the user from contacting the metal of the ground clips and dictated the use of a single ground wire system. If a user reverts to probes without the extra insulation, a hazard could exist if that probe is improperly connected to elevated voltages.

Full isolation techniques can provide superior safety, but are generally expensive to implement. With full isolation, each channel has some form of galvanic isolation, meaning that no conductors directly tie the input stages to the "core" of the instrument. Instead, the signal passes from one section to another via magnetic or optical coupling, or a combination of both.

Full isolation techniques have two main advantages. One of these includes the complete absence of a DC leakage path and very minimal AC leakage. Regarding the absence of a DC leakage path, there is simply no path for current to flow no matter what the user does with the input probes. AC leakage current is minimal, due only to the parasitic capacitance that couples the isolated input stage to the instrument core and back out to the other individually isolated channels. Also, with full isolation, each channel can still make normal and accurate measurements regardless of any difference between the probe ground clips (at least up to the breakdown limit of the isolation devices).

These advantages, naturally, come with a price. Many extra components are generally required to achieve full isolation. And, the optical and magnetic components needed for galvanic isolation tend to be relatively expensive. Moreover, to cover the frequency range required for an isolated oscilloscope, it typically takes a combination of both optical and magnetic coupling to cover the frequency spectrum. (Optical coupling is effective from DC to a few megahertz, while magnetic coupling can cover frequencies from hundreds of kilohertz to hundreds of megahertz.)

In the case of the prior art THS7X0 family of isolated scopes, there is a patented circuit that makes the optical and magnetic coupling work in concert to produce a flat seamless result from DC to 200 MHz. U.S. Pat. No. 5,517,154 to Baker et al. for "Split-Path Linear Isolation Circuit Apparatus and Method" is hereby incorporated by reference. That patent describes a split-path isolation amplifier that employs a transformer in a high frequency path and a single-input, dual-output closed-loop optical coupler in a low frequency path. This achieves a flat, wide frequency response without need for frequency compensation adjustments.

In a low frequency path, the optocoupler provides all or most of the signal to the output. The isolation amplifier employs a substantially overlapped crossover frequency region in which the high signal is applied to a primary winding of the transformer, and the low path signal is applied differentially to secondary windings of the transformer. At frequencies below the crossover frequency range, the signal from the optocoupler dominates as the signal coupled from the signal coupled from the primary winding rolls off. At frequencies above the crossover frequency range, the signal coupled from the primary winding dominates as the signal coupled from the primary winding rolls off. At frequencies within the crossover frequency range magnetic flux components generated by the primary and secondary transformer windings co-act to provide a combined output signal having a flat frequency response. The only adjustments are those required to match the gain of the low path to the gain of the high path and to compensate for any offset in the low path.

In addition to these magnetic and optical components, which are fairly expensive, there is the additional need for power supply isolation. It is not enough to simply isolate the signal paths since the channels would not actually be isolated from each other if they shared the same power source. Therefore there must be circuits that pass power to individual channels. A switching regulator circuit is needed to generate the AC to pass through each channel's power transformer, as well as converting the AC back to a refined and regulated power source on each channel. The total cost of the components for full isolation is relatively high.

What is needed is a common (ground) system that is doubly protected against damaging and dangerous faults, and which is constructed from relatively inexpensive parts.

BRIEF SUMMARY OF THE INVENTION

The present invention provides redundant electrical safety and a much lower parts cost relative to full isolation techniques. The circuit senses excess current in any common path, i.e., current exceeding a predetermined safe level, and automatically opens solid state switches to disconnect all common paths when the current in any of those common paths is sensed to be too high. A positive temperature coefficient (PTC) resistance element in series with each solid state switch provides automatic redundant protection.

BRIEF DESCRIPTION OF THE SEVERAL VIEWS

FIGS. 1A and 1B are schematic diagrams of two circuits according to the prior art. FIG. 1A shows a circuit with direct connections between the channel grounds and the instrument ground. FIG. 1B shows a circuit where the channel commons are coupled to a protected instrument ground through PTC devices.

DETAILED DESCRIPTION OF THE INVENTION

Figure 1A:
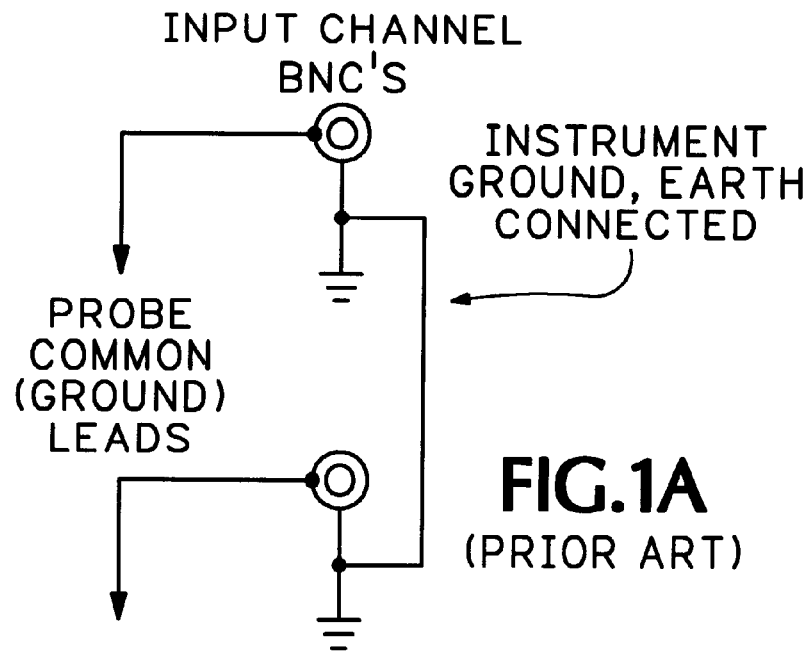
Figure 1B:
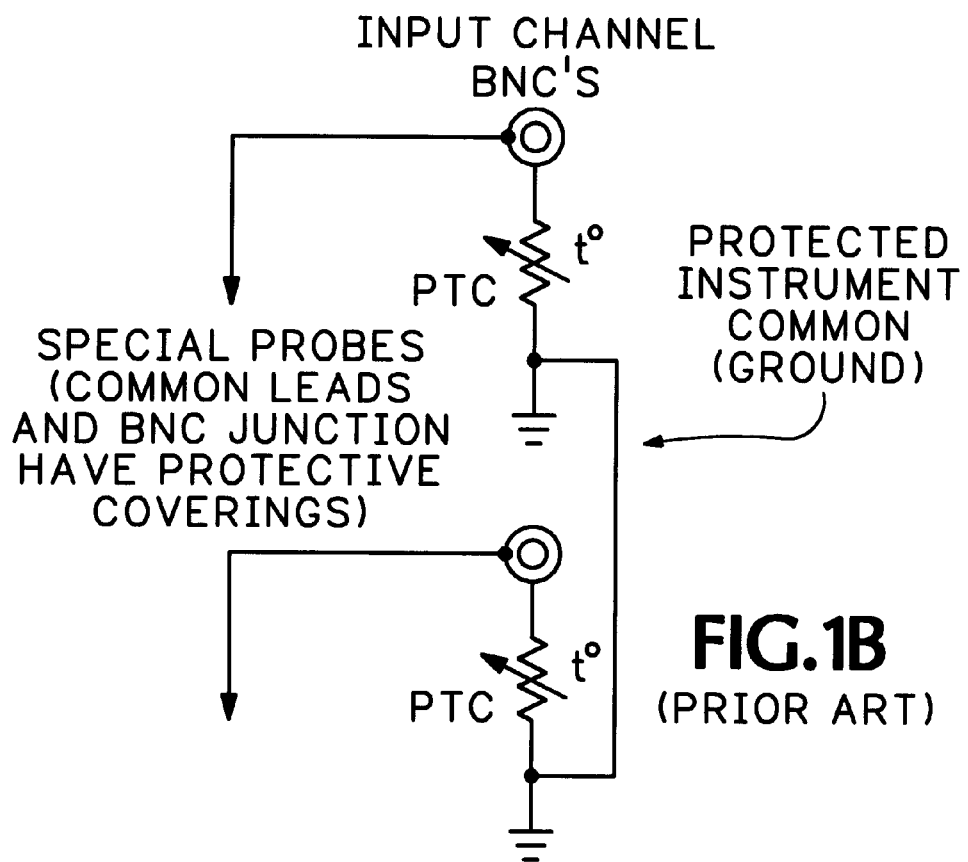
Figure 2:
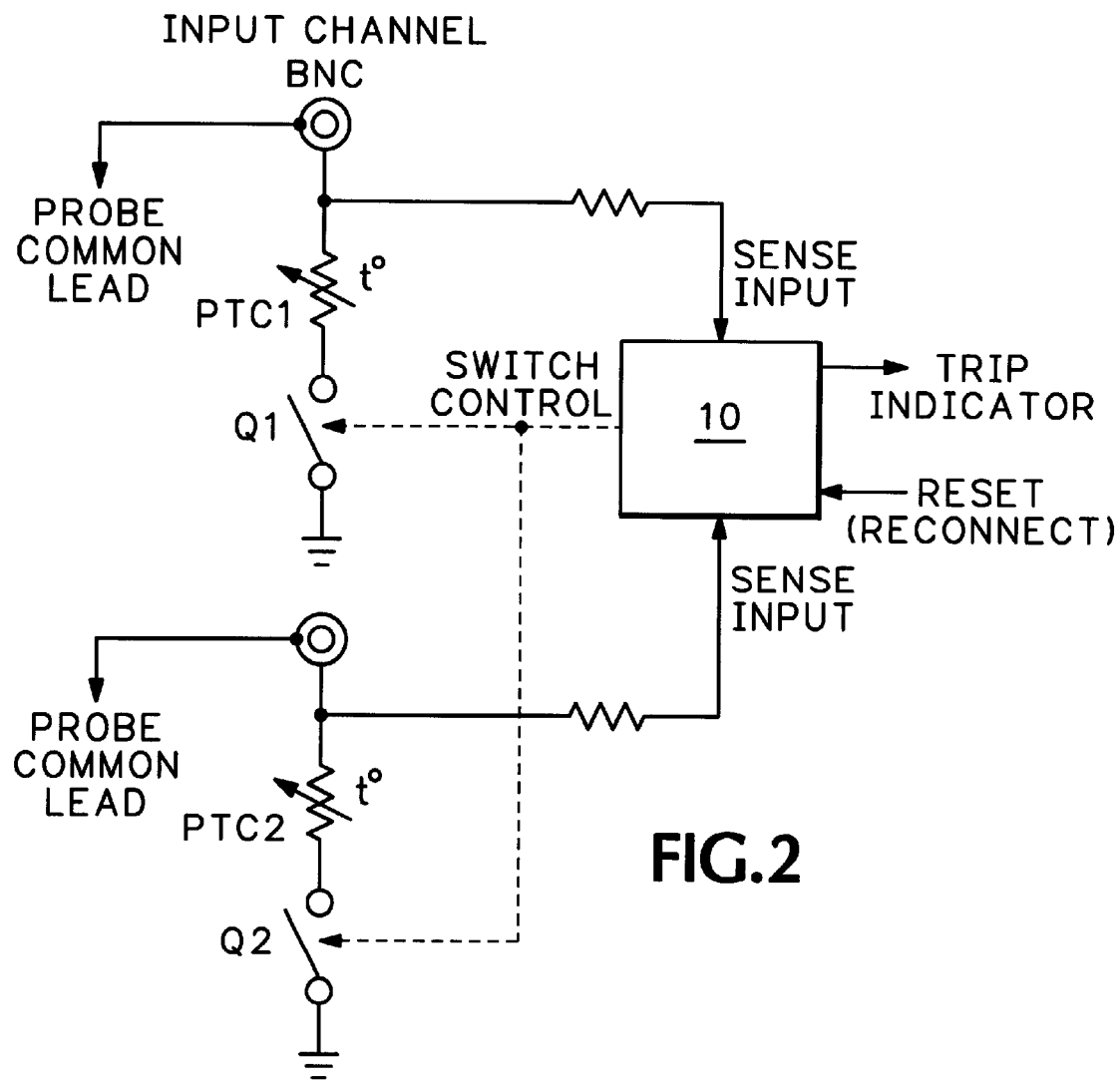
FIG. 2 is a schematic diagram of a circuit according to the present invention, with extra protection provided by solid state switches in series with PTC devices, those switches being controlled by current sensing and control circuitry.

FIG. 2 is a schematic diagram of a circuit according to the present invention, with extra protection provided by solid state switches Q1 and Q2 in series with devices PTC1 and PTC2. The current sensing and control circuitry 10 has sense inputs from each channel common. It operates switch control signals to open Q1 and Q2 when a ground current fault is detected. The same BNC common connections are also coupled to the internal instrument ground by a pair of low impedance pathways, one of which comprises the series elements PTC1 and Q1, and the other of which comprises the series elements PTC2 and Q2. Conduction through Q1 and Q2 is controlled by the switch control output of the current sense and control 10. In normal operation both transistors are conducting to provide low impedance DC ground paths.

Figure 3:
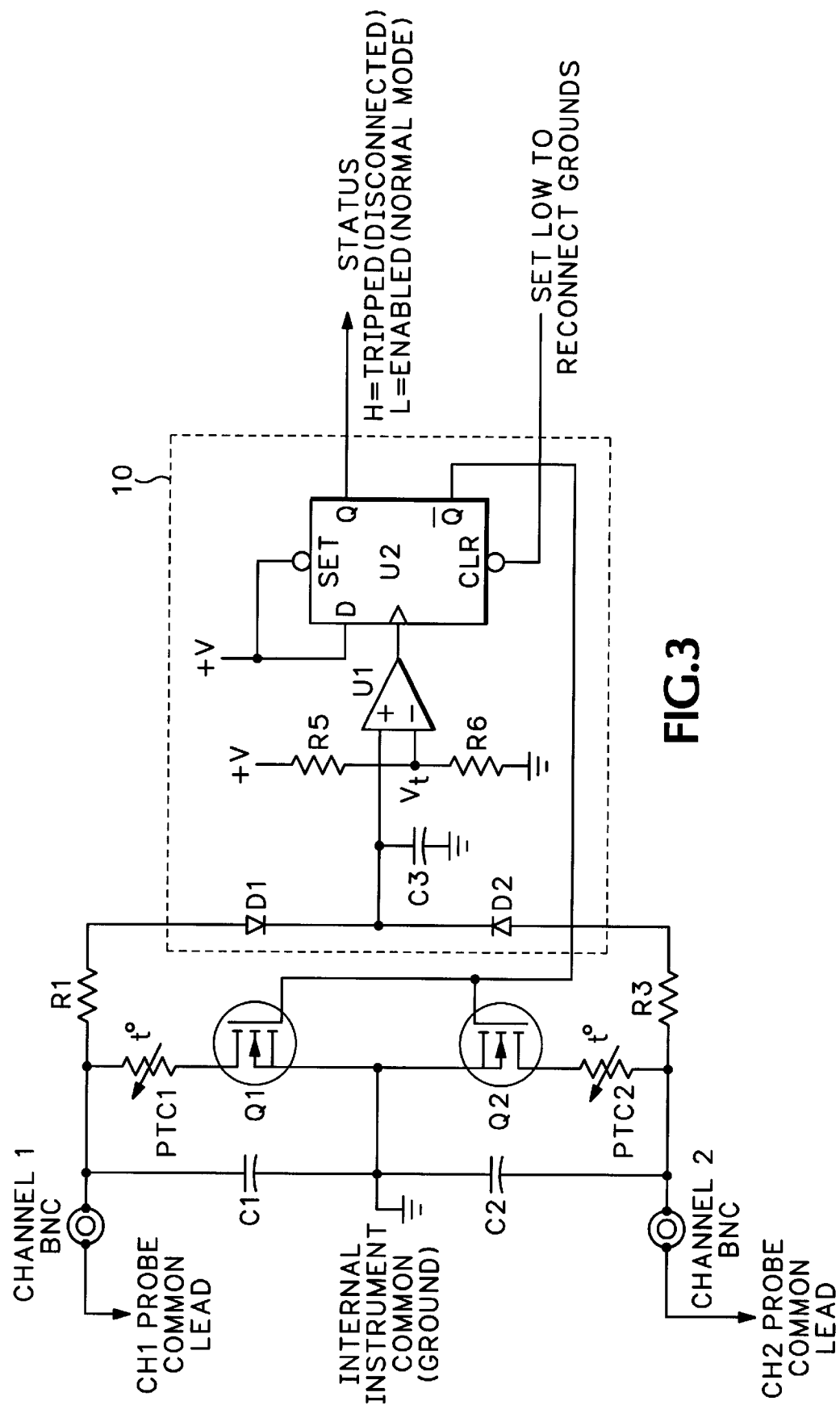
FIG. 3 is a detailed schematic diagram of another circuit according to the present invention. This view, with its extra detail, illustrates how the current sensing and switch controls may be implemented.

FIG. 3 is a detailed schematic diagram of another circuit according to the present invention. This view illustrates how the current sensing and switch controls may be implemented. BNC common connections are coupled to the internal instrument ground by high frequency bypass capacitors C1 and C2, respectively. The same BNC ground connections are also coupled to the internal instrument ground by a pair of low impedance pathways, one of which comprises the series elements PTC1 and Q1, and the other of which comprises the series elements PTC2 and Q2. Conduction through Q1 and Q2 is controlled by the /Q output of U2, and in normal operation both transistors are conducting to provide a low impedance DC path. While the /Q output of U2 controls transistors Q1 and Q2, the Q output of U2 communicates the control circuit status. A high output indicates that the safety circuitry has been tripped, i.e., common leads disconnected. A low output indicates that the safety circuitry is enabled, i.e., operating in the normal mode. A CLR input to U2 responds to an active low signal by reconnecting the channel and instrument grounds. U2 is clocked by the output of U1, and when it makes a transition from low to high a ground fault has been detected. The U2 Q output then goes high, while the /Q output goes low.

As a voltage potential arises across the exposed commons of the BNC connectors, voltage develops across PTC1 and an opposite voltage develops across PTC2. This voltage is coupled to D1 and D2 through the current limiting resistors R1 and R3, respectively, the output nodes of these resistors are then coupled to the sensing circuit input by D1 and D2. Depending on the polarity of the voltage across the exposed BNC common connections, one or the other of the diodes D1 and D2 will be forward biased and apply a voltage to the top of C3. This voltage is compared with Vt, and when the diode-coupled voltage exceeds Vt, the output of U1 makes the transition from low-to-high.

When the voltage on C3 exceeds Vt, and the output of U1, the voltage set by voltage dividers R5 and R6, the output of comparator U1 goes from low to high, clocking U2. Since the D input of U2 is connected to a positive voltage, the clock signal input causes U2 to set, producing a high Q output and a low /Q output. The low /Q output of U2 shuts off Q1 and Q2, actively disconnecting the paths between the external exposed conductors and the internal instrument ground.

The only direct current that will pass through the exposed ground connectors once U2 is tripped is the current limited by R1 or R3. Alternating current still has a path through C1 and C2, but for most applications with potentially dangerous voltages, the frequency is low enough that the current through C1 and C2 is not harmful. The capacitors C1 and C2 are chosen to be the minimum value that is required to maintain signal integrity during a fast rising step fed into the signal input path of equipment. This maintains the transient response such that there is no degrading effect of the signal path(s) due to the resistance inserted in the ground nodes. Bypass capacitors C1 and C2 also create a path for electrostatic discharge that serve to protect the switches Q1 and Q2, as well as the system as a whole.

Capacitor C3 filters electrical noise or spikes, and its value is important in preventing false (nuisance) tripping of the active ground disconnect circuit. The intended application and value of the current limiting resistors R1 and R2 determine the appropriate capacitance value.

Still referring to FIG. 3, the values of components C1, C2, R1, R3, Q1, Q2, PTC1 and PTC2 must all be rated for maximum expected peak fault voltages. U1 and U2 and their associated circuitry is one way, but not the only way, that the sense and control circuitry 10 can be implemented. The same function can be accomplished with discrete transistors and control provided by nearly any type of microprocessor or simple logic. Q1 and Q2 are enhancement mode MOSFETS with, in the example, logic level gate thresholds. The PTC resistors typically are from 500 ohms to 1K ohms in their (normal) cold state. Resistance values for R1 and R3 are set based on the desired maximum DC leakage current in the tripped condition.

The function of the PTC resistors are primarily to act as a redundant protective impedance in the event of a control circuitry or switch failure. Since UL and CSA, who are nationally recognized safety test organizations, have already approved measurement equipment that uses only PTC resistors as protection, with bypass capacitors for signal integrity, any control circuitry or switching device fault will, at worse case, revert to that approved level of protection.

If a ground fault potential is applied across the common leads long enough to get through the glitch filter R1 or R3/C3 and cause a tripped condition, means are then needed for resetting the system. Safety certification requires that there be explicit recognition of the fault by the user and a subsequent manual resetting performed before the user can proceed with further measurements. This can be done as part of the equipment user interface through the use of a message on a display screen instructing what needs to be done to accomplish this resetting operation of the AGD system or some trip indicator device with an associated reset button much like a resettable fuse. In the implementation illustrated in FIG. 3, a microprocessor monitors the status output of U2, and when the correct user action has been taken, the program can pulse the CLR line low to cause a reconnection of the ground paths. When power to the measurement instrument is turned off, the gate voltages on Q1 and Q2 drops to zero and inherently disconnects the common (ground) paths, making it safe in all conditions.

Figure 4A:
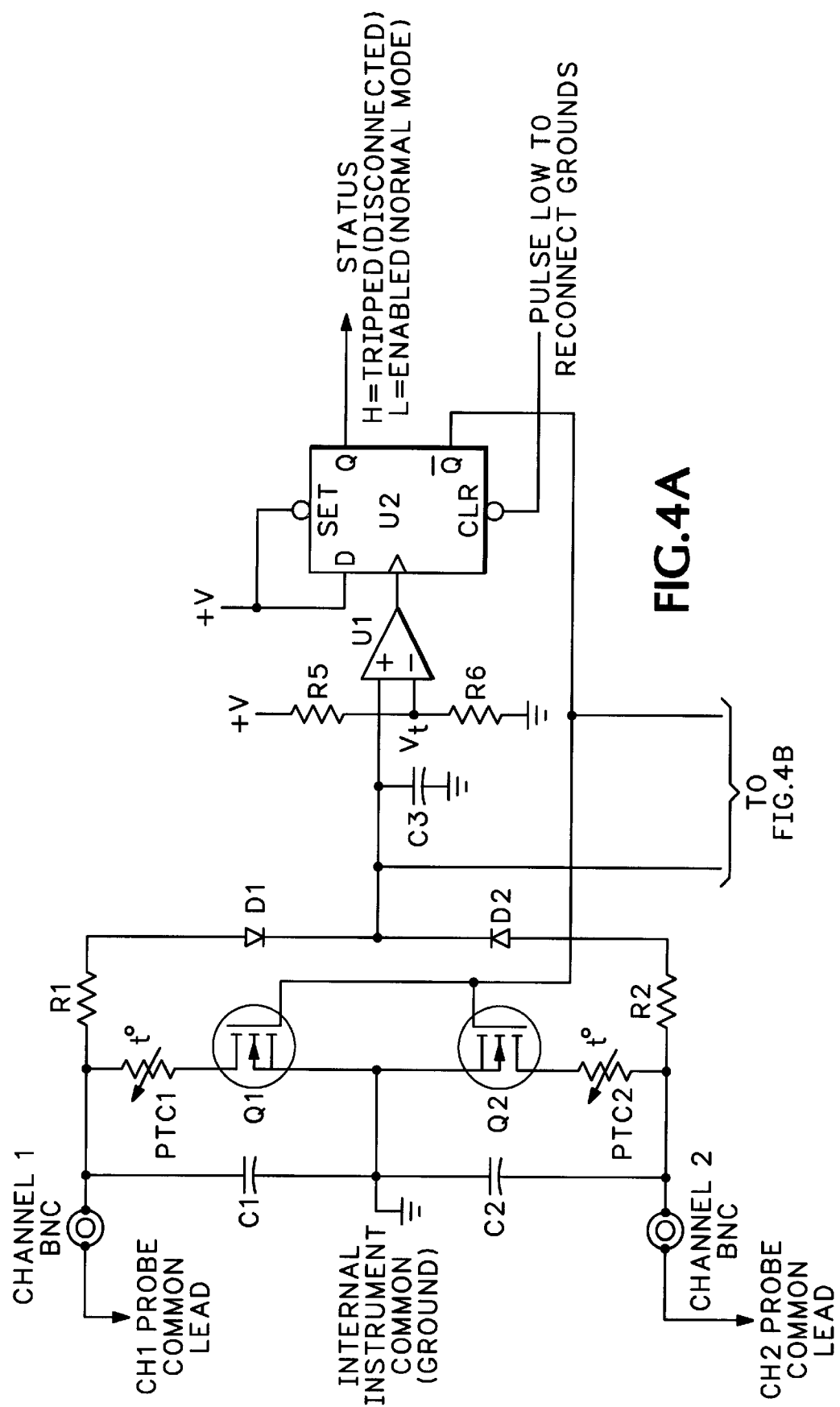
FIG. 4 is a version of the present invention with a larger number of channels, all channels opened by excess current detected in any channel.
Figure 4B:
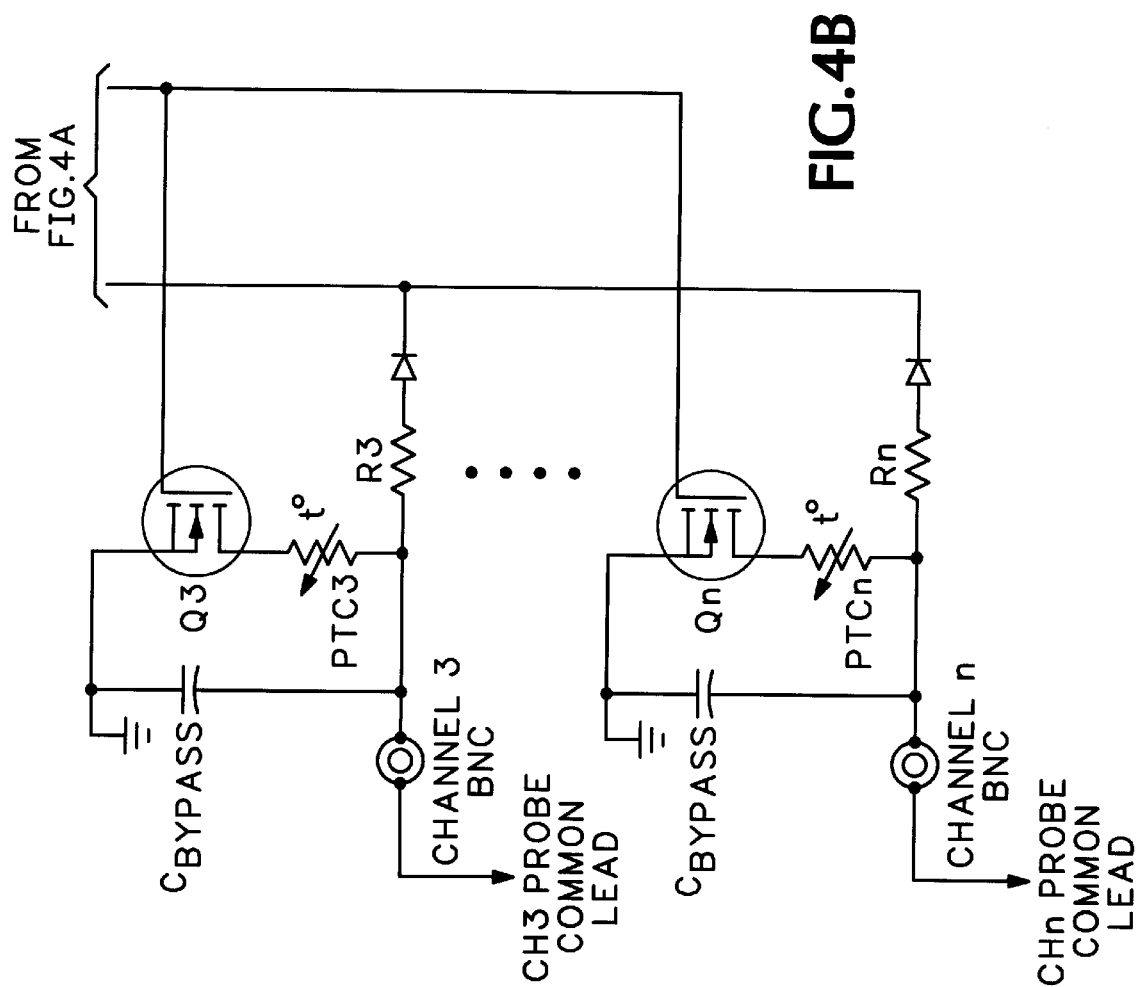

Referring next to FIG. 4, the same general principles of the invention can be applied to multiple channel environments. As can be seen toward the bottom of this Figure, additional sets of transistor switches, such as Q3 and Qn, and PTC resistors, such as PTC3 and PTCn, can be monitored through R3 and Rn by the drop across Q3/PTC3 and Qn/PTCn. The same principles shown here for use with exposed common connectors can also be used with other exposed conductive nodes that float, thereby improving the safety and reliability of the equipment.

Figure 5:
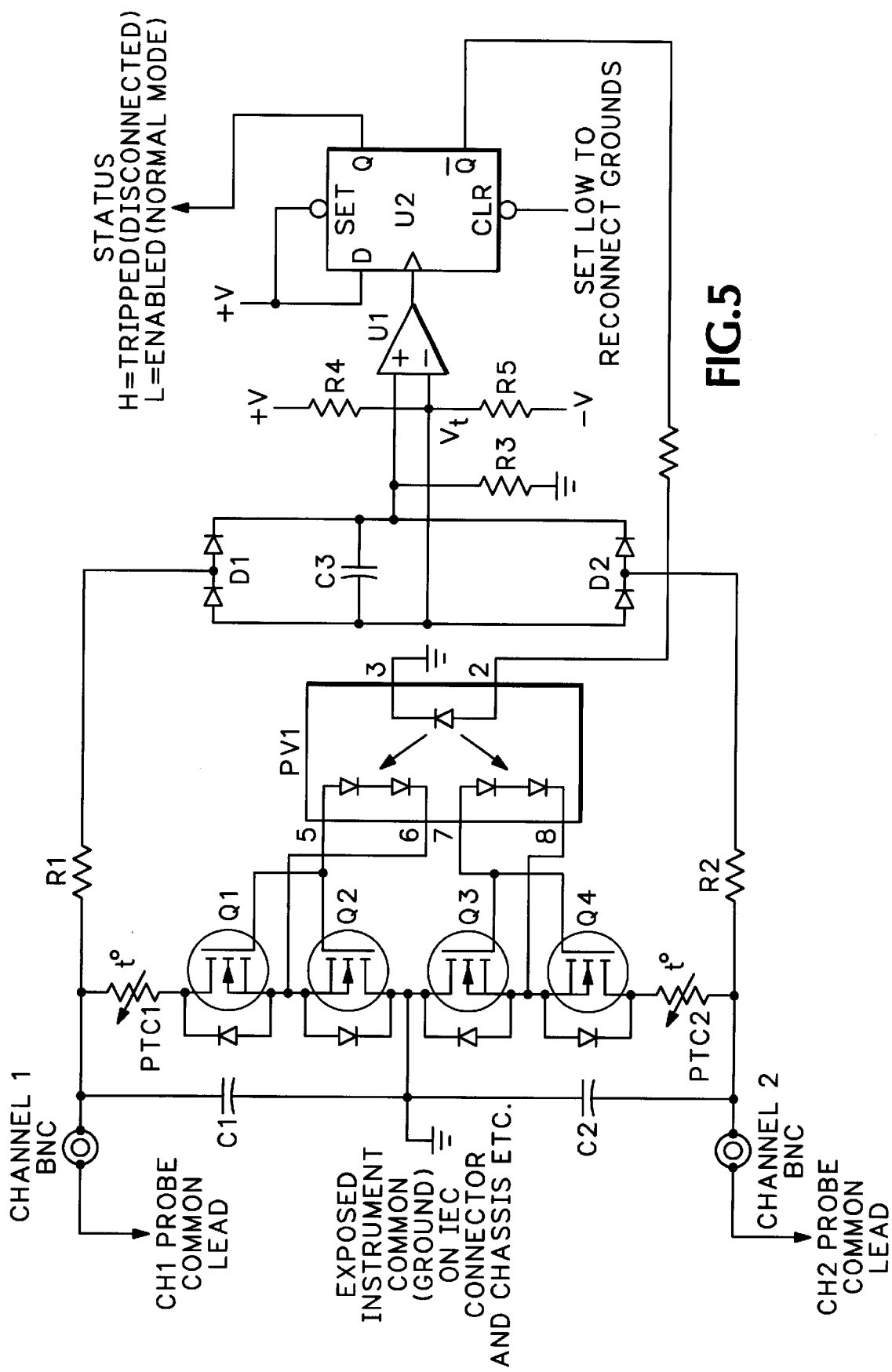
FIG. 5 is a schematic diagram of a circuit according to the present invention wherein the control feedback is delivered via non-galvanic isolation means.

Referring last to FIG. 5, this circuit operates much like the circuit shown in FIG. 3, except that photoisolator PV1 couples the control signals back to the solid state switching transistors Q1, Q2, Q3, and Q4, which now appear in pairs. Diodes D1 and D2 are now each a pair of diodes. Each photoisolator supports control of two channels in this example.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patent laws of the countries in which this patent is granted.

What is claimed is:

1. An electronic measurement instrument having at least one channel, the channel having a signal path and a common path, with the common path comprising:
    passive protection means;
    active protection means, the active protection means being disposed in series with the passive protection means; and
    control means, the control means monitoring a current flow through the ground path and activating the active protection means upon detection of an excess current flow in the common path.

2. An electronic measurement instrument according to claim 1 wherein the passive protection means comprises a PTC resistor.

3. An electronic measurement instrument according to claim 1 wherein the passive protection means comprises a PTC thermistor.

4. An electronic measurement instrument according to claim 1 wherein the active protection means comprises an electronic switch that opens upon detection of excess current flow in the common path.

5. An electronic measurement instrument according to claim 1 wherein the control means comprises:

voltage sensing means comprising a resistor; and control circuitry, said control circuitry having a sensing input node and a control output node, with the sensing input node coupled to be responsive to the output node of the voltage sensing means, and the control output node coupled to control the active protection means according to a voltage present at the sensing input node.

6. An electronic measurement instrument according to claim 1 wherein the instrument is electrically isolated and "floating".

7. An electronic measurement instrument according to claim 6 wherein the passive protection means comprise a PTC resistor.

8. An electronic measurement instrument according to claim 6 wherein the active protection means comprises an electronic switch that opens upon detection of excess current flow in the common path.

9. An electronic measurement instrument according to claim 6 wherein the control means comprises:

voltage sensing means comprising a resistor used as a current limiting impedance; and control circuitry, said control circuitry having a sensing input node and a control output node, with the sensing input node coupled to be responsive to the output node of the voltage sensing means, and the control output node coupled to control the active protection means according to a voltage present at the sensing input node.

* * * * *